US 6,659,095 B2

(12) United States Patent
Kotwicki et al.

(10) Patent No.: US 6,659,095 B2
(45) Date of Patent: Dec. 9, 2003

(54) DIAGNOSIS SYSTEM FOR UPSTREAM GAUGE SENSOR, DOWNSTREAM ABSOLUTE PRESSURE SENSOR

(75) Inventors: Allan J. Kotwicki, Williamsburg, MI (US); Freeman Carter Gates, Bloomfield, MI (US); Hossein Bina, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 326 days.

(21) Appl. No.: 09/681,860

(22) Filed: Jun. 19, 2001

(65) Prior Publication Data

US 2002/0189599 A1 Dec. 19, 2002

(51) Int. Cl.[7] .......................... F02D 41/14; F02M 25/07
(52) U.S. Cl. .................. 123/690; 123/479; 123/568.16; 123/568.22; 73/118.2; 73/861.61
(58) Field of Search ................. 123/435, 436, 123/672, 676, 677, 679, 684, 690, 478, 479, 480, 568.16, 568.21, 568.22; 73/116, 117.3, 118.1, 118.2, 861.61, 861.52; 701/101, 102, 103, 104, 105, 108, 109, 111, 114

(56) References Cited

U.S. PATENT DOCUMENTS

| 4,821,194 | A | * | 4/1989 | Kawamura ................ 123/479 |
| 5,136,517 | A |   | 8/1992 | Cullen et al. |
| 5,241,940 | A | * | 9/1993 | Gates, Jr. .................... 123/676 |
| 5,613,479 | A |   | 3/1997 | Gates et al. |
| 5,635,633 | A | * | 6/1997 | Kadota ....................... 73/118.1 |
| 5,698,780 | A | * | 12/1997 | Mizutani et al. .......... 73/118.2 |
| 5,808,189 | A | * | 9/1998 | Toyoda ....................... 73/118.2 |
| 5,988,149 | A |   | 11/1999 | Gates |
| 6,095,123 | A |   | 8/2000 | Kotwicki et al. |
| 6,138,504 | A |   | 10/2000 | Lewis et al. |
| 6,182,644 | B1 |   | 2/2001 | Kotwicki et al. |
| 6,434,474 | B1 | * | 8/2002 | Kotwicki et al. .......... 701/108 |
| 6,459,985 | B1 | * | 10/2002 | Kotwicki et al. .......... 701/108 |

FOREIGN PATENT DOCUMENTS

| GB | 2321317 | 7/1998 |
| JP | 10-18920 | 1/1998 |
| JP | 2001-182602 | 7/2001 |

* cited by examiner

Primary Examiner—Willis R. Wolfe
(74) Attorney, Agent, or Firm—Allan J. Lippa; Kolisch Hartwell, P.C.

(57) ABSTRACT

A method for controlling an engine during sensor degradation uses a remaining active sensor. The engine has an exhaust gas recirculation system utilizing pressure sensors upstream and downstream of an orifice. The downstream pressure sensor is coupled to the engine intake manifold and is also used for engine air-fuel ratio control.

13 Claims, 4 Drawing Sheets

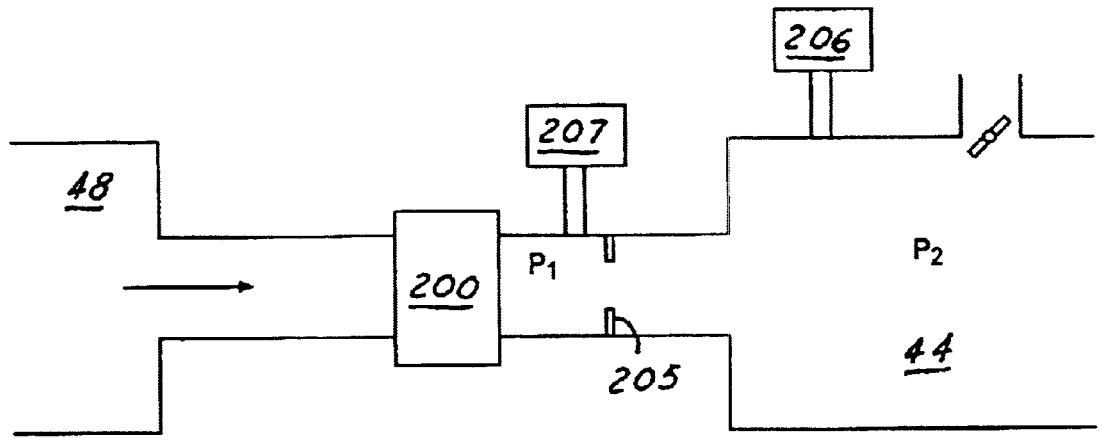
FIG. 2
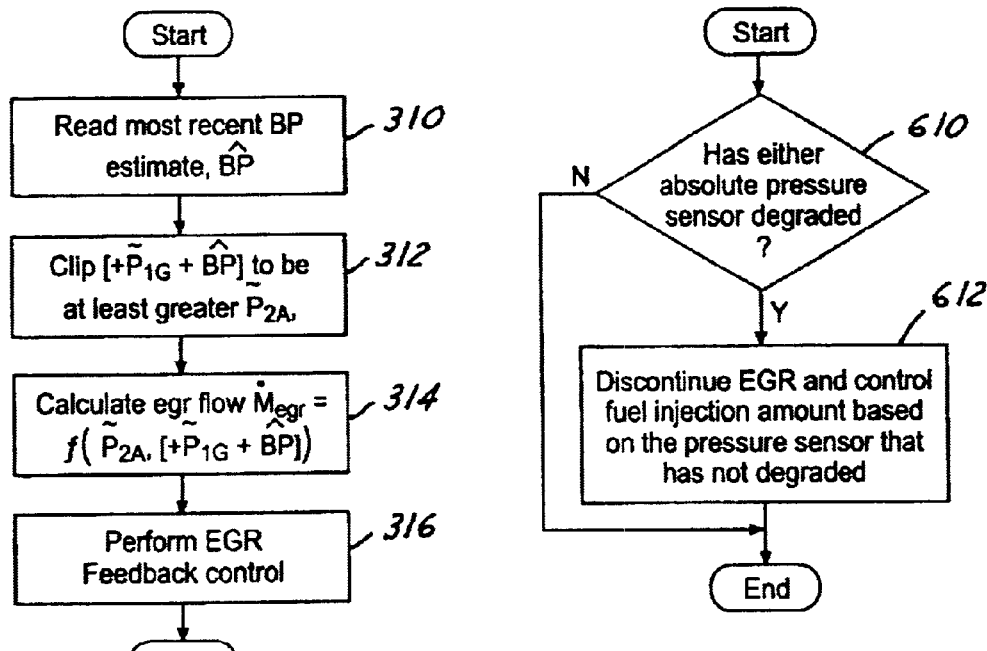
FIG. 3
FIG. 6

DIAGNOSIS SYSTEM FOR UPSTREAM GAUGE SENSOR, DOWNSTREAM ABSOLUTE PRESSURE SENSOR

BACKGROUND OF INVENTION

1. Technical Field

The field of the invention relates to engine systems using pressure sensors. In particular, the field of the invention relates to systems that use a determination of barometric pressure.

2. Background of the Invention

Engine systems are known which utilize exhaust gas recirculation (EGR) to reduce engine emission and increase fuel economy. In one example, two pressure sensors are utilized not only to calculate EGR flow into the engine, but also to control air-fuel ratio. Typically, one sensor is coupled to the intake manifold and another is coupled in the EGR pathway between an EGR valve and an orifice. Such a system that provides dual use of sensors can offer cost advantages. Such a system is described in U.S. Pat. No. 6,138,504.

The inventors herein have recognized that there is a potential that the pressure sensors in such a system may degrade. In particular, if the intake manifold pressure sensor degrades, engine air-fuel ratio control may degrade thus affecting emissions. Further, if the pressure sensor coupled to the EGR system degrades, EGR flow control and flow estimation may degrade.

SUMMARY OF INVENTION

In one example, the above advantages over prior approaches are provided by a method for controlling an engine coupled to an exhaust gas recirculation system, the engine coupled to a first pressure sensor and the exhaust gas recirculation system coupled to second pressure sensor. The method comprises determining whether at least one of the first and second pressure sensor has degraded, and in response to said determination, discontinuing exhaust gas recirculation and calculating an engine air intake amount based on the other of said indicated at least one pressure sensor.

By utilizing the remaining operational pressure sensor when one pressure sensor has degraded, it is possible to accurately determine air entering the engine and therefore accurately control engine air-fuel ratio. This is particularly true since EGR has been discontinued. For example, the amount of EGR flowing into the engine affects the amount of fresh air inducted for a given manifold pressure. Thus, by discontinuing EGR, this error source is removed and accurate air determination is possible even with a reduced sensor set.

An advantage of the invention is improved engine control during sensor degradation.

Another advantage of the invention is that engine operation can be continued even when sensor degradation occurs.

BRIEF DESCRIPTION OF DRAWINGS

The advantages described herein will be more fully understood by reading an example of an embodiment in which the invention is used to advantage, referred to herein as the Description of the Preferred Embodiment, with reference to the drawings wherein:

FIG. 2 is a schematic diagram of the EGR system;

FIGS. 3–6 are a high level flowcharts of various routines for controlling EGR flow.

DETAILED DESCRIPTION

Figure 1:
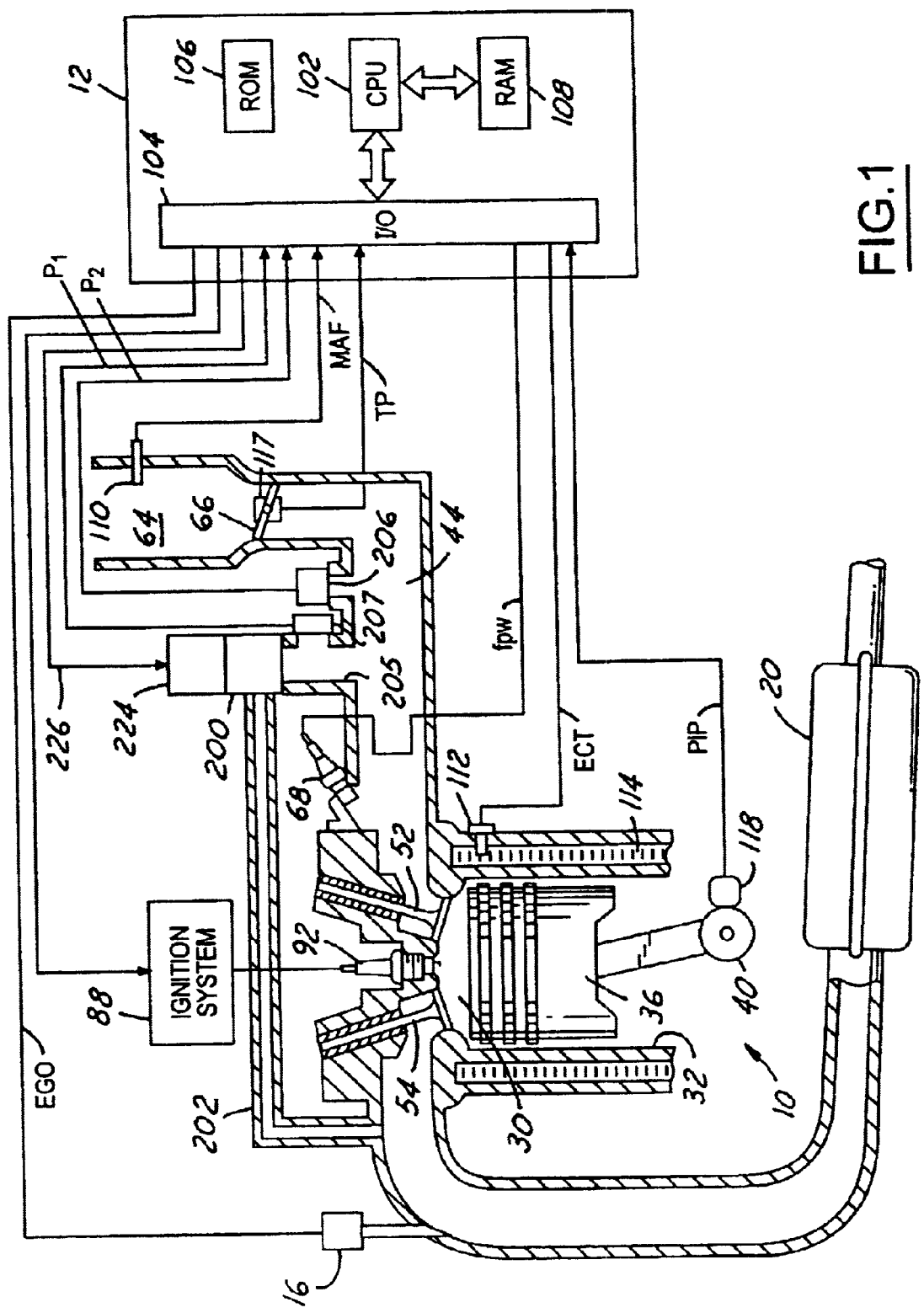
FIG. 1 is a block diagram of an engine in which the invention is used to advantage.

Internal combustion engine 10, comprising a plurality of cylinders, one cylinder of which is shown in FIG. 1, is controlled by electronic engine controller 12. Engine 10 includes combustion chamber 30 and cylinder walls 32 with piston 36 positioned therein and connected to crankshaft 40. Combustion chamber 30 communicates with intake manifold 44 and exhaust manifold 48 via respective intake valve 52 and exhaust valve 54. Exhaust gas oxygen sensor 16 is coupled to exhaust manifold 48 of engine 10 upstream of catalytic converter 20.

Intake manifold 44 communicates with throttle body 64 via throttle plate 66. Intake manifold 44 is also shown having fuel injector 68 coupled thereto for delivering fuel in proportion to the pulse width of signal (fpw) from controller 12. Fuel is delivered to fuel injector 68 by a conventional fuel system (not shown) including a fuel tank, fuel pump, and fuel rail (not shown). Engine 10 further includes conventional distributorless ignition system 88 to provide ignition spark to combustion chamber 30 via spark plug 92 in response to controller 12. In the embodiment described herein, controller 12 is a conventional microcomputer including: microprocessor unit 102, input/output ports 104, electronic memory chip 106, which is an electronically programmable memory in this particular example, random access memory 108, and a conventional data bus.

Controller 12 receives various signals from sensors coupled to engine 10, in addition to those signals previously discussed, including: measurements of inducted mass air flow (MAF) from mass air flow sensor 110 coupled to throttle body 64; engine coolant temperature (ECT) from temperature sensor 112 coupled to cooling jacket 114; a measurement of manifold pressure (MAP) from manifold pressure sensor 116 coupled to intake manifold 44; a measurement of throttle position (TP) from throttle position sensor 117 coupled to throttle plate 66; and a profile ignition pickup signal (PIP) from Hall effect sensor 118 coupled to crankshaft 40 indicating and engine speed (N).

Exhaust gas is delivered to intake manifold 44 by a conventional EGR tube 202 communicating with exhaust manifold 48, EGR valve assembly 200, and EGR orifice 205. Alternatively, tube 202 could be an internally routed passage in the engine that communicates between exhaust manifold 48 and intake manifold 44. Pressure sensor 206 communicates with EGR tube 202 between valve assembly 200 and orifice 205. Pressure sensor 207 communicates with intake manifold 44. Stated another way, exhaust gas travels from exhaust manifold 44 first through valve assembly 200, then through EGR orifice 205, to intake manifold 44. EGR valve assembly 200 can then be said to be located upstream of orifice 205. Also, pressure sensor 206 can be either absolute pressure sensor 700 or a gauge pressure sensor 800, which are described later herein in FIGS. 7 and 8. Further, pressure sensor 207 can be either absolute pressure sensor 700 or a gauge pressure sensor 800. Further yet, pressure sensor 206 can be absolute pressure sensor 700, while pressure sensor 207 can be gauge pressure sensor 800.

Flow sensor 206 provides a measurement of manifold pressure (MAP) and pressure drop across orifice 205 (DP) to controller 12. Signals MAP and DP are then used to calculated EGR flow as described later herein with particular reference to FIGS. 3–5. EGR valve assembly 200 has a valve position (not shown) for controlling a variable area restriction in EGR tube 202, which thereby controls EGR flow. EGR valve assembly 200 can either minimally restrict EGR flow through tube 202 or completely restrict EGR flow through tube 202. Vacuum regulator 224 is coupled to EGR valve assembly 200. Vacuum regulator 224 receives actuation signal (226) from controller 12 for controlling valve position of EGR valve assembly 200. In a preferred embodiment, EGR valve assembly 200 is a vacuum actuated valve. However, as is obvious to those skilled in the art, any type of flow control valve may be used such as, for example, an electrical solenoid powered valve or a stepper motor powered valve.

Referring now to FIG. 3, a routine is described for feedback controlling exhaust gas recirculation according to the present invention.

First, in step 310, the most recent BP estimate (BPA) is read. The routine for updating the BP estimate is described later herein with particular reference to FIG. 4.

Next, in step 312, the routine determines the absolute pressure upstream of orifice 205. In particular, the absolute pressure upstream of orifice 205 is determined based on the sum of the most recent BP estimate and the measured gauge pressure upstream of orifice 205. Further, this upstream absolute pressure is clipped to be at least greater than the absolute pressure measured by the absolute pressure sensor downstream of orifice 205. Further, if it is necessary to clip the values, this indicates that the estimate of barometric pressure has degraded. Thus, according to the present invention, when this clipping occurs, the desired EGR flow is set to zero so that the barometric pressure can be updated as described later herein with particular reference to FIG. 4.

Next, in step 314, the EGR flow is determined based on the upstream absolute pressure and downstream absolute pressure using function f. In one aspect of the present invention, function f is structured so that EGR flow is calculated based on the square root of the product of downstream absolute pressure and differential pressure across orifice 205. Then, in step 316, feedback EGR control is performed based on a desired EGR flow and the calculated EGR flow from step 314.

Figure 4:
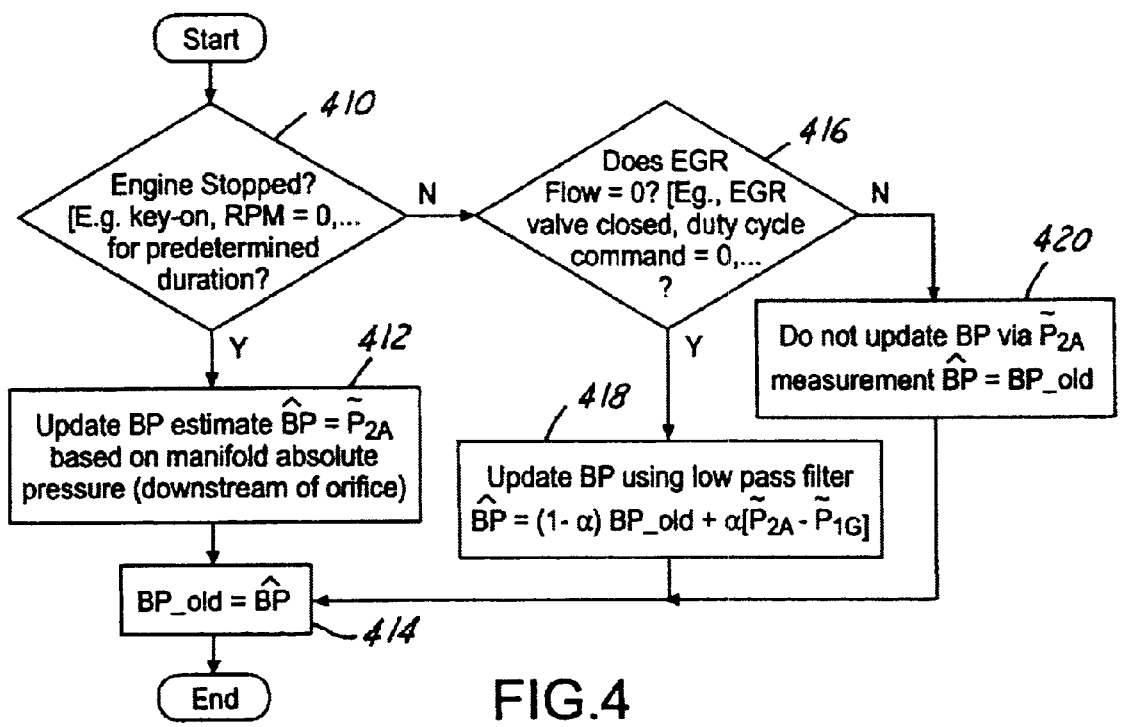

Referring now to FIG. 4, a routine is described for estimating atmospheric pressure, or barometric pressure, during vehicle operation.

First, in step 410, a determination is made as to whether the engine is stopped. This can be determined by, for example, determining whether the ignition key is on, whether engine rpm is zero, or whether engine speed is zero for a predetermined duration, or whether engine fuel injection is zero, or various other parameters that indicate that the engine is stopped. When the answer to step 410 is yes, the routine continues to step 412. In step 412, the routine updates the BP estimate based on the measured absolute pressure downstream orifice 205, which in this embodiment is also the manifold absolute pressure. In other words, when the engine is stopped, the routine determines absolute barometric pressure based on the measured manifold pressure, or pressure downstream of orifice 205. Then, in step 414, the old barometric pressure is set equal to the most recently updated barometric pressure.

When the answer to step 410 is no, the routine continues to step 416, where a determination is made as to whether the EGR flow is substantially equal to zero. There are various methods for determining whether EGR flow is equal to zero such as, for example, determining whether the EGR valve is closed, determining whether the duty cycle command to the EGR valve is zero, determining whether the pressure upstream of the orifice is approximately equal to pressure downstream of the orifice, or any other parameter that indicates that EGR flow is substantially equal to zero. Further, the definition of "substantially" equal to zero is when the indication of flow based on the pressure sensors is equal to a value that would be caused by noise on the sensors during engine operation. For example, the flow is substantially zero when the flow indicated is less than 10% of the maximum flow through the system during the present engine operating conditions. Also, pressure upstream is approximately equal to pressure downstream of the orifice when, for example, the pressure values are within 10% of each other. However, this depends on the accuracy of the sensor and the amount of noise that is generated during the present engine operating conditions. When the answer to step 416 is yes, the routine continues to step 418.

In step 418, the barometric pressure estimate is updated using a low pass filter in the equation in the Figure. In other words, when the EGR flow is zero, the absolute pressure upstream of orifice 205 is substantially equal to the absolute pressure downstream of orifice 205 since there is no flow. Thus, the absolute pressure measurement of the downstream pressure can be used in conjunction with the gauge pressure measurement upstream of orifice 205 to determine the reference pressure to the gauge sensor. In this example, the reference pressure to the gauge pressure sensor, which measures the gauge pressure upstream of orifice 205, is atmospheric pressure. Thus, according to the present invention, when EGR flow is zero, it is possible to accurately measure the atmospheric pressure using both the gauge and absolute pressure sensors coupled upstream and downstream of orifice 205.

When the answer to step 416 is no, the barometric pressure estimate is not updated via the absolute pressure measurement downstream of orifice 205 but is set equal to the old BP estimate value. However, in an alternative embodiment, other estimates can be used at this time to provide an estimate of barometric pressure. For example, the engine mass airflow sensor and throttle position can be used to estimate barometric pressure. Thus, according to the present invention, a routine is described that can provide online estimates of atmospheric pressure during vehicle driving conditions when the EGR flow is equal to zero using an upstream gauge pressure sensor and a downstream absolute pressure sensor.

Figure 5:
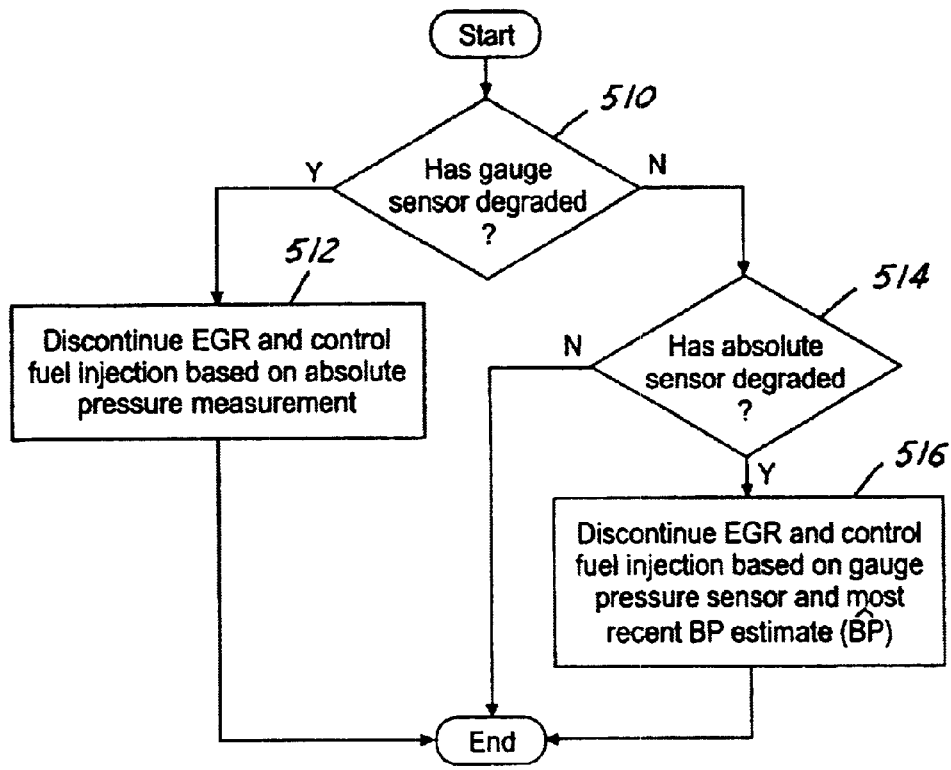

Referring now to FIG. 5, a routine is described for default operation of an engine EGR system having an upstream gauge pressure sensor and a downstream absolute pressure sensor.

First, in step 510 a determination is made as to whether the gauge pressure sensor has degraded. When the answer to step 510 is yes, the routine continues to step 512. In particular, degradation can be determined based on a variety of methods. For example, sensor voltage can be compared to an allowable range. If sensor voltage is outside of the allowable range, degradation can be indicated. Further, an estimate of the sensor value can be obtained using other engine operating parameters and then compared with the sensor reading. If this comparison gives a difference that is greater than an allowable value, degradation is indicated.

In step 512, the routine discontinues EGR flow and controls fuel injection based on the absolute pressure measurement downstream of orifice 205 (manifold pressure). In other words, the routine calculates the fuel injection amount based on speed density equations that relate air induction amount to manifold pressure and engine speed and engine manifold temperature. In this way, it is possible to continue engine operation even when upstream gauge pressure sensor has degraded. Also, fuel injection can be further adjusted based on feedback from a signal from sensor 16 indicative of exhaust air-fuel ratio.

When the answer to step 510 is no, a determination is made in step 514 as to whether downstream absolute pressure sensor has degraded. When the answer to step 514 is yes, the routine continues to step 516. For example, sensor voltage can be compared to an allowable range. If sensor voltage is outside of the allowable range, degradation can be indicated. Further, an estimate of the sensor value can be obtained using other engine operating parameters and then compared with the sensor reading. If this comparison gives a difference that is greater than an allowable value, degradation is indicated.

In step 516, the routine discontinues EGR flow and controls fuel injection amount based on the gauge pressure sensor and the most recent barometric pressure estimate. In other words, when EGR flow is zero, the absolute pressure upstream of orifice 205 is approximately equal to the absolute pressure downstream of orifice 205. Thus, by using the gauge pressure upstream of orifice 205 and the most recent estimate of barometric pressure, it is possible to estimate an absolute pressure downstream of orifice 205 (estimated intake manifold pressure). Then, this estimated manifold pressure can be used with the speed density functions to calculate a proper fuel injection amount. Thus, according to the present invention, it is possible to continue accurate engine operation of a system having an upstream gauge pressure sensor and a downstream absolute pressure sensor, when the downstream absolute pressure sensor has degraded.

Referring now to FIG. 6, a routine is provided for default operation of an engine EGR system having two absolute pressure sensors, one upstream of orifice 205 and one downstream of orifice 205.

First, in step 610, a determination is made as to whether either absolute pressure sensor is degraded. When the answer to step 610 is yes, the routine discontinues EGR and controls fuel injection amount based on the absolute pressure sensor that has not degraded. In other words, when EGR flow is zero, both absolute pressure sensors should be reading approximately the same absolute pressure. Thus, the routine uses whichever sensor has not degraded to provide the fuel injection control.

While various methods can be used to determine whether a pressure sensor has degraded, one potential method is to determine whether the voltage output is within acceptable predetermined voltage limits. Thus, if the voltage read by the sensor is outside of this acceptable output range, degradation can be indicated. However, there are various other methods for determining degradation such as using other engine operating parameters to estimate the pressure, and indicating degradation when these values disagree by a predetermined amount.

In an alternative embodiment, the present invention can be utilized with a hybrid electric vehicle system. In this system, an engine and an electric motor are coupled to the vehicle. In some operating modes, both the engine and the electric motor drive the vehicle. In other operating modes, only the engine or only the electric motor drive the vehicle. In still other operating modes, the engine drives the electric motor to recharge a battery system. According to the present invention, it is possible to update a barometric pressure estimate when the vehicle is driven by the electric motor and the engine is stopped (see step 410 of FIG. 4). In other words, estimates of barometric pressure can be obtained while the vehicle is operating under the pure electric mode and the engine is stopped. Thus, it is possible to provide continuing updates in barometric pressure using a manifold absolute pressure sensor.

Figure 7:
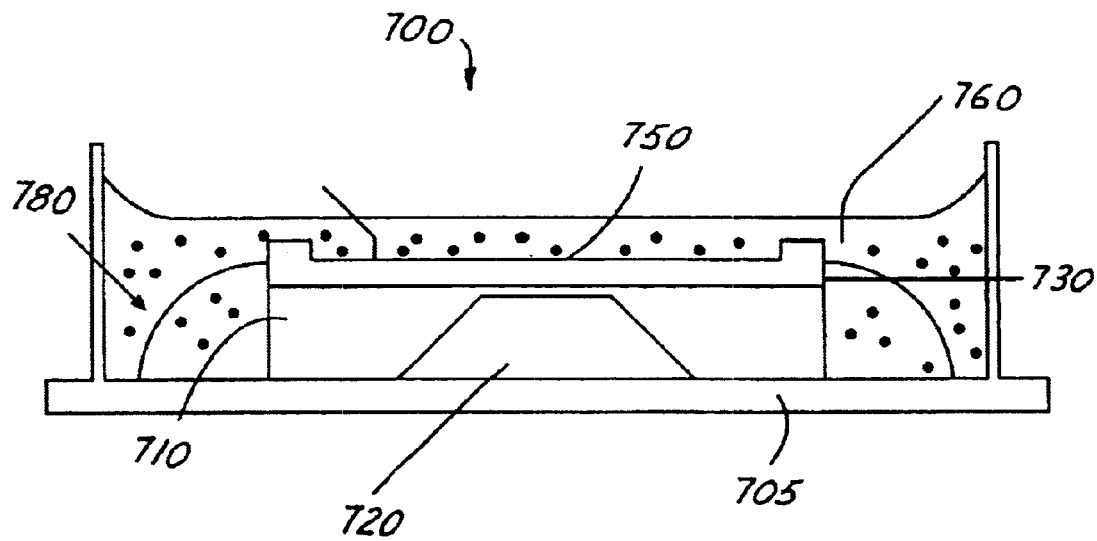
FIGS. 7–8 are schematic diagrams of pressure sensors.

Referring now to FIG. 7, a schematic diagram of an absolute pressure sensor is described. In particular, absolute pressure sensor 700, which is coupled to engine intake manifold 44, is described. Absolute pressure sensor 700 comprises a base structure 705, which supports the pressure sensor elements as described below. Coupled to base 705 is support member 710. Support member 710 is comprised of silicon. Support member 710 has a sealed vacuum reference chamber 720 within. Vacuum reference chamber serves as a regulated reference pressure so that sensor 700 can provide an indication of absolute pressure sensor regulated reference pressure is known and fixed. Coupled to support 710 are aluminum conductors and an electronics layer 730. This aluminum conductor and electronics layer 730 contains sensitive electronic components that convert the applied pressure and the vacuum reference into electrical signals provided to controller 12. A nitride layer 740 is coupled on top of aluminum conductor and electronics layer 730. Also, gold wire bonds 780 connect the aluminum conductor and electronics layer 730 to base 705. A gel layer 760 surrounds the aluminum conductor and electronics layer 730, nitride layer 740, support 710, vacuum reference 720, and gold wire bonds 780. The pressure to be measured is applied to gel layer 760. Gel layer 760 protects the sensitive electronics in layer 730 from the gases creating the applied pressure.

The inventors herein have recognized that while it is possible to manufacture a gel layer, which can protect the electronics from hot exhaust gases containing various contaminants, this can be an expensive approach. Thus, according to the present invention, absolute sensor is used to measure intake manifold pressure, which is comprised primarily of fresh air inducted past throttle plate 66 from the atmosphere. Thus, a relatively inexpensive gel layer 760 can be utilized and exploited. Thus, while it is possible to use an absolute sensor such as described above to measure exhaust pressures, it is also desirable to provide alternative methods and systems that do not rely solely on absolute pressure sensors.

Figure 8:
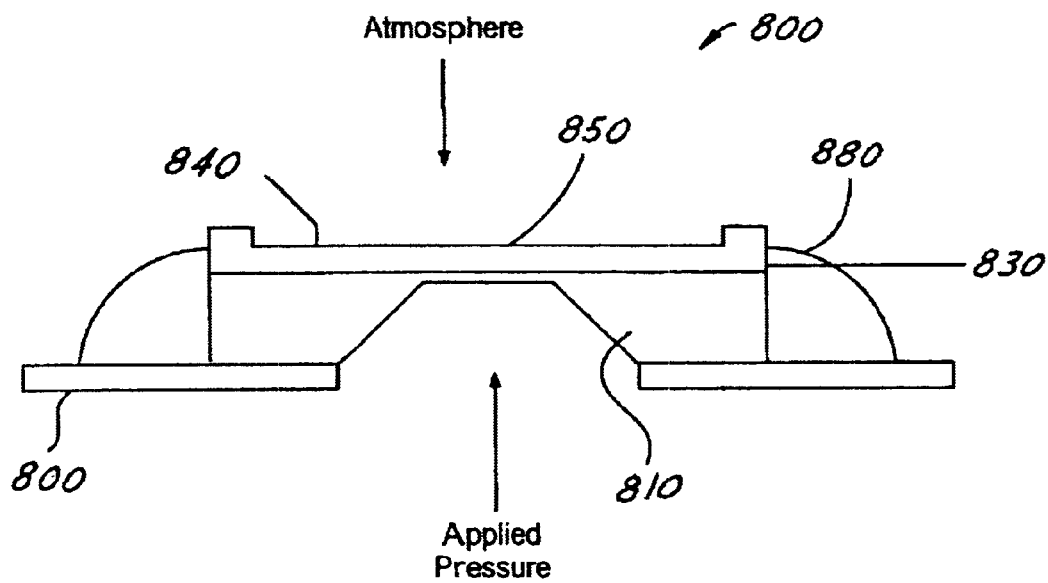

Referring now to FIG. 8, gauge pressure sensor 800 is described. In this particular embodiment, gauge pressure sensor 800 is measured relative to atmospheric pressure. However, various other reference pressures may be used. Base 800 is shown coupled to support 810. Support 810 is comprised of silicon. Aluminum conductors and electronics layer 830 is coupled to one side of support 810. The opposite side of support 810 is constructed so that the measured, or applied, pressure is in contact with support 810.

As above, aluminum conductors and electronics layer 830 comprise sensitive electronic components. Nitride layer 840 is coupled to aluminum conductors and electronics layer 830. Also, diaphragm 850 is coupled within nitride layer 840 and coupled to aluminum electronics layer 830. Atmospheric pressure is applied to diaphragm 850 and nitride layer 840. Gold wire bonds 880 couple aluminum electronics layer 830 to base 800.

The inventors herein have recognized that gauge pressure sensor 800 does not suffer from the disadvantages suffered by absolute sensor 700 with respect to the requirements for gel layer 760. In other words, with gauge pressure sensor 800, it is possible to measure exhaust pressure as the applied pressure, without adding expensive gels to protect the sensitive electronics in the layer 830.

Thus, according to the present invention, a method is described for controlling exhaust gas recirculation using an absolute sensor to measure intake manifold pressure (which does not require expensive gels since intake manifold pressure gases are at a lower temperature and have less contaminants than exhaust pressure gases) and a gauge pressure sensor to measure a pressure of recycled exhaust gases (which can be at a higher temperature and have various contaminants). In other words, gauge pressure sensor 800 can be manufactured cheaply and provide useful measurements of recycled exhaust gases. Thus, according to the present invention, a reduced cost system can be provided.

Although several examples of the invention have been described herein, there are numerous other examples that could also be described. For example, the invention can also be used with various types of emission control devices such as so-called lean burn catalysts. Further, the improved barometric pressure estimate can be used in other engine control systems. For example, the improved barometric pressure estimate can be used in scheduling engine actuators and desired engine operating points. In particular, the improved barometric pressure estimate can be used in determining a desired EGR flow, or EGR valve, set-point. Then, the measured, or estimated EGR flow value can be used in a feedback control scheme so that the actual EGR flow, or valve position, approaches the set-point value. Further, the improved barometric pressure estimate can be used in determining a ignition timing set-point. In other words, desired ignition timing can be varied based on the determined barometric pressure.

What is claimed is:

1. A method for controlling an engine coupled to an exhaust gas recirculation system, the engine coupled to a first pressure sensor and the exhaust gas recirculation system coupled to second pressure sensor, the method comprising:
   determining whether at least one of the first and second pressure sensor has degraded;
   in response to said determination:
      discontinuing exhaust gas recirculation;
      calculating an engine air intake amount based on said first pressure sensor when said second signal has degraded; and
      calculating an engine air intake amount based on said second pressure sensor when said first signal has degraded.

2. A vehicle system comprising:
   an engine;
   an electric motor coupled to the engine, said motor capable of driving the vehicle when the engine is not producing power;
   an orifice coupled to the engine;
   a first gauge sensor coupled upstream of the orifice;
   a second absolute sensor coupled downstream of the orifice;
   a controller providing an indication in response to said motor driving the vehicle with the engine not producing power, and determining atmospheric pressure based on said upstream gauge pressure sensor and said downstream absolute pressure sensor in response to said indication.

3. A system for use with an engine comprising:
   an orifice
   a gauge pressure sensor coupled upstream of the orifice;
   an absolute pressure sensor coupled downstream of the orifice;
   a controller for indicating degradation of one of said gauge pressure sensor and said absolute pressure sensor based on a measured condition that is measured by the controller.

4. The system recited in claim 3 wherein said controller further adjusts an engine operating state in response to said indication of degradation.

5. A method for controlling an engine coupled to an exhaust gas recirculation system, the engine coupled to a first pressure sensor and the exhaust gas recirculation system coupled to second pressure sensor, the method comprising:
   determining whether at least one of the first and second pressure sensor has degraded;
   in response to said determination:
      discontinuing exhaust gas recirculation;
      calculating an engine air intake amount based on the other of said determined at least one pressure sensor.

6. The method recited in claim 5, further comprising adjusting a fuel injection amount based on said calculated engine air intake amount.

7. The method recited in claim 6, further comprising adjusting said fuel injection amount based on feedback from an exhaust gas sensor coupled to an exhaust of the engine.

8. A method for controlling an engine coupled to an exhaust gas recirculation system, the engine coupled to a first pressure sensor and the exhaust gas recirculation system coupled to second pressure sensor, the method comprising:
   determining whether the first pressure sensor has degraded;
   in response to said determination:
      discontinuing exhaust gas recirculation; and
      adjusting a fuel injection amount into the engine based on said second pressure sensor to control engine air-fuel ratio.

9. The method recited in claim 8 wherein said adjusting said fuel injection further comprises adjusting said fuel injection amount based on an estimate of atmospheric pressure.

10. The method recited in claim 8 wherein said adjusting said fuel injection further comprises adjusting said fuel injection amount based on feedback from an exhaust gas sensor.

11. A method for controlling an engine coupled to an exhaust gas recirculation system, the engine coupled to a first pressure sensor and the exhaust gas recirculation system coupled to second pressure sensor, the method comprising:
   determining whether the second pressure sensor has degraded;
   in response to said determination:
      discontinuing exhaust gas recirculation
      adjusting a fuel injection amount into the engine based on said first pressure sensor to control engine air-fuel ratio.

12. The method recited in claim 11 wherein the first pressure sensor indicates absolute pressure an intake manifold of the engine.

13. The method recited in claim 12 wherein the second pressure sensor indicates pressure in the exhaust gas recirculation system relative to atmospheric pressure.

* * * * *